US008817841B2

United States Patent
Bafra et al.

(10) Patent No.: US 8,817,841 B2
(45) Date of Patent: Aug. 26, 2014

(54) SYSTEM AND METHOD OF CONTROLLING MODULATION FREQUENCY OF SPREAD-SPECTRUM SIGNAL

(75) Inventors: Arda Kamil Bafra, Istanbul (TR); Levent Yakay, Istanbul (TR); Mustafa Ertugrul Oner, San Jose, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 1174 days.

(21) Appl. No.: 12/611,907

(22) Filed: Nov. 3, 2009

(65) Prior Publication Data

US 2011/0103427 A1    May 5, 2011

(51) Int. Cl.
 *H04B 1/00*    (2006.01)
(52) U.S. Cl.
 USPC ............ 375/130; 375/135; 375/140; 375/146
(58) Field of Classification Search
 USPC .................................................. 375/130–153
 See application file for complete search history.

(56) References Cited

U.S. PATENT DOCUMENTS

| | | | | |
|---|---|---|---|---|
| 2005/0008113 | A1* | 1/2005 | Kokubo et al. | 375/376 |
| 2005/0077935 | A1* | 4/2005 | Giuroiu | 327/156 |
| 2006/0176933 | A1* | 8/2006 | Uemura et al. | 375/130 |
| 2008/0303566 | A1* | 12/2008 | Shen et al. | 327/157 |

OTHER PUBLICATIONS

Office Action dated Jan. 6, 2014, in related Chinese Patent Application No. 201010536207.2 (6pgs).

* cited by examiner

*Primary Examiner* — Curtis Odom
(74) *Attorney, Agent, or Firm* — North Weber & Baugh LLP

(57) ABSTRACT

An apparatus for generating a spread-spectrum signal based on an input signal whose frequency may vary substantially. The apparatus is particularly suited for controlling the frequency of the modulation in response to wide variations of the frequency of the input signal. This prevents the modulation frequency from deviating into an undesired frequency range which could cause adverse operational effects. The apparatus includes a detector adapted to generate a first signal related to the frequency of the input signal, a controller adapted to generate a second signal for controlling a frequency of a modulation signal based on the first signal, a modulation signal generator adapted to generate the modulation signal based on the second signal, and a spread-spectrum signal generator adapted to generate the spread-spectrum signal based on the modulation signal.

25 Claims, 4 Drawing Sheets

SYSTEM AND METHOD OF CONTROLLING MODULATION FREQUENCY OF SPREAD-SPECTRUM SIGNAL

FIELD OF THE INVENTION

This invention relates generally to modulated or spread-spectrum signals, and in particular, to a system and method of controlling the modulation frequency of spread-spectrum signal.

BACKGROUND OF THE INVENTION

In many applications, data is sent in a serial manner from a transmitting device to a receiving device. Often, the data originates in the transmitting device as parallel data. Accordingly, in order to convert parallel data into serial data for transmission, the transmitting device typically includes a serializer. The serializer, in turn, typically includes a multiplexer with inputs adapted to receive the parallel data, an output adapted to produce the serial data, and a clock input adapted to receive a clock signal for clocking out the serial data. Typically, the serializer includes a phase locked loop (PLL) module adapted to generate the clock signal for clocking out the serial data based on a clock signal associated with the parallel data.

At the receiving device, a deserializer is typically employed to receive the serial data and convert it back into parallel data. The deserializer typically includes a phase locked loop (PLL) circuit to recover and generate a clock signal associated with the serial data, since the data is often transmitted without an associated clock signal. The deserializer further includes a de-multiplexer including an input to receive the serial data, outputs to produce the parallel data, and a clock input to receive the recovered clock signal in order to clock the serial data at the input to the parallel outputs of the deserializer.

In many applications, the clock signal that drives the serializer has a substantially fixed frequency so that the serial data is transmitted to the receiving device at a substantially constant rate. However, the constant rate of the serial data produces relatively high energy approximate the data rate frequency, which may leak from the system and cause electromagnetic interference (EMI). To combat EMI, specialized wired mediums, such as shielded twisted pair or coaxial cable, are often employed between the transmitting and receiving devices in order to substantially reduce EMI. However, typically such specialized wired medium are expensive and consume a relatively large footprint. Moreover, even with shielded twisted pair cable, the EMI of the system might be undesirably high, mostly due to the transmitter and receiver housings not being shielded well due to cost and design reasons.

Another technique of reducing EMI is to spread the frequency spectrum of the transmitted serial data. That is, instead of clocking the serializer with a substantially fixed frequency clock signal, the serializer is clocked with a modulated or spread-spectrum clock signal. In this manner, the energy of the transmitted serial data is no longer concentrated at substantially a single frequency, but spread over a defined frequency range. This lowers the energy of the signal at a given frequency, which, in turn, leads to reduced EMI.

Often, the serializer/deserializer pair are designed for general purposes. Accordingly, they are designed to operate over a relatively wide frequency range or data rates. Thus, the clock signal driving the serializer may have a relatively wide frequency range. The frequency of the modulation applied to the clock signal for spread-spectrum purposes is typically configured to vary as a function of the frequency of the clock signal. Accordingly, if the frequency of the clock signal varies substantially, then the frequency of the modulation may also vary substantially. This may have adverse effects in the case, for example, where the modulation frequency falls into an audio band which may produce audio interference, or rises too high for a downstream device to be able to recover the clock signal.

SUMMARY OF THE INVENTION

An aspect of the invention relates to an apparatus for generating a spread-spectrum signal based on an input signal whose frequency may be selected from a relatively wide frequency range. The apparatus is particularly suited for controlling the frequency of the modulation based on the frequency of the input signal. In this manner, the frequency of the input signal may be configured for different applications, and thus may vary significantly, while the apparatus is able to maintain the modulation frequency within a defined frequency range. This prevents the modulation frequency from deviating into an undesired frequency range, which could cause adverse operational effects.

More specifically, the apparatus comprises a detector adapted to generate a first signal related to the frequency of the input signal, a controller adapted to generate a second signal for controlling a frequency of a modulation signal based on the first signal, a modulation signal generator adapted to generate the modulation signal based on the second signal, and a spread-spectrum signal generator adapted to generate the spread-spectrum signal based on the modulation signal.

In another aspect of the invention, the input signal frequency detector comprises a first counter adapted to generate a third signal having an asserted width related to the frequency of the input signal, a second counter adapted to generate a count based substantially on a number of periods of a reference oscillator signal that are generated within the asserted width of the third signal, and a first register adapted to output the count. The first signal for controlling the modulation frequency may be based on the count.

In another aspect of the invention, the controller is adapted to generate the second signal to maintain the frequency of the modulation signal to within a defined frequency range in response to variation in the frequency of the input signal. The controller may comprise a decoder adapted to generate the second signal based on the first signal (e.g., the count). The decoder may comprise a look-up-table (LUT) for mapping the first signal (e.g., the count) to the second signal. Alternatively, the decoder may be adapted to execute an algorithm or perform an equation operation to generate the second signal from the first signal (e.g., the count). The controller may further include a second register adapted to output the second signal.

In another aspect of the invention, the modulation signal generator comprises a frequency divider adapted to divide the frequency of a signal derived from the input signal by a factor controlled by the second signal generated by the modulation frequency controller. The modulation signal generator further comprises a modulation waveform generator adapted to generate an oscillating signal with a period comprising a defined number of steps, wherein the frequency of the steps is governed by the output of the frequency divider. Additionally, the modulation signal generator comprises a delta-sigma modulator adapted to further randomize and filter the oscillating signal from the modulation waveform generator in order to generate the modulation signal.

In another aspect of the invention, the spread-spectrum signal generator comprises a phase lock loop (PLL) including a phase-frequency detector, a charge pump, a loop filter, a voltage controlled oscillator (VCO), and a programmable frequency divider. The phase-frequency detector is adapted to generate an error signal based on a signal derived from the input signal, and a feedback signal from the programmable frequency divider. The charge pump and loop filter are adapted to generate a control signal for the VCO based on the error signal. The VCO is adapted to generate the spread-spectrum signal based on the control signal. The programmable frequency divider is adapted to generate the feedback signal by dividing the frequency of the spread-spectrum signal based on a factor controlled by the modulation signal. The feedback signal may serve as an input to the frequency divider of the modulation signal generator.

Other aspects, advantages and novel features of the present invention will become apparent from the following detailed description of the invention when considered in conjunction with the accompanying drawings.

DETAILED DESCRIPTION OF THE EXEMPLARY EMBODIMENTS

Figure 1:
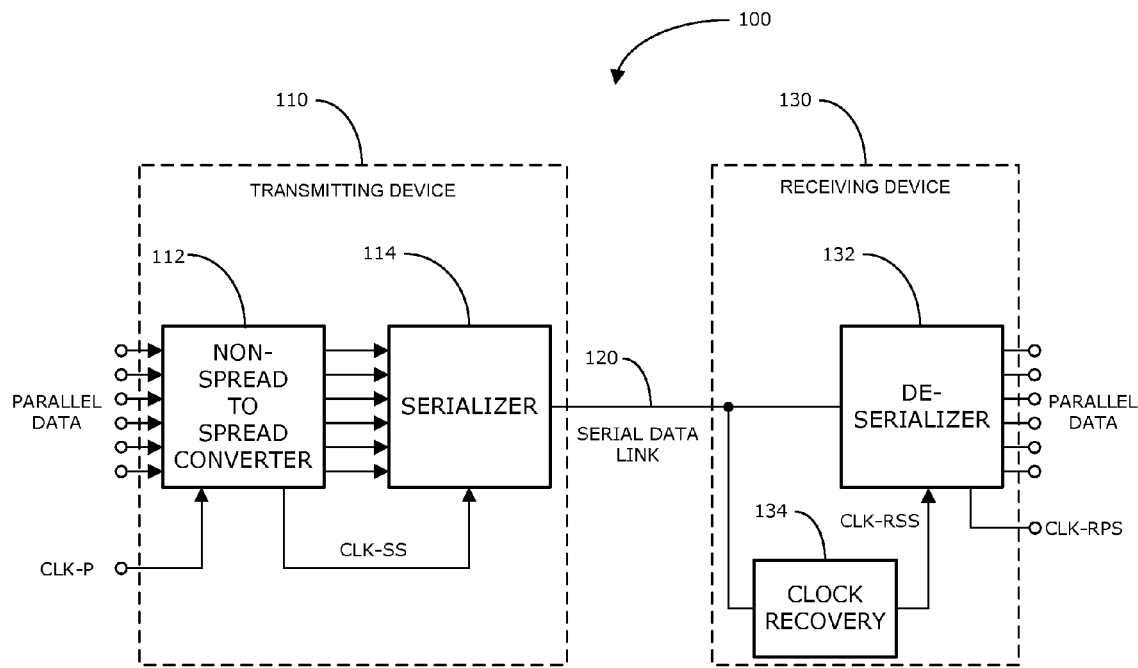
FIG. 1 illustrates a block diagram of an exemplary data communication system in accordance with an embodiment of the invention.

FIG. 1 illustrates a block diagram of an exemplary data communication system 100 in accordance with an embodiment of the invention. In summary, the data communication system 100 is configured to transmit serial data from a transmitting device to a receiving device that is modulated for spread-spectrum, EMI reduction, and/or other purposes. Additionally, the transmitting device further controls the frequency of the modulation signal based on the frequency of a clock signal associated with input data.

This allows the frequency of the input clock signal to be selected from a relatively wide range in order to provide flexibility for the rate in which the data is transmitted, while at the same time controlling the frequency of the modulation to be within a defined frequency range. As an example, the frequency of the modulation signal may be controlled to be within 20 kHz to 40 KHz. This may prevent audio interference by not allowing the modulation signal to fall below 20 kHz. This also allows a clock recovery device at the receiving device to be able to recover the clock signal by not allowing the modulation signal to rise above its capability. Again, these are merely examples, and the frequency of the modulation signal may be controlled to within any defined frequency range.

More specifically, the data communication system 100 comprises a transmitting device 110, a receiving device 130, and a serial data link 120 coupling the transmitting device to the receiving device. The transmitting device 110, in turn, comprises a non-spread-to-spread-spectrum converter 112, and a serializer 114. The non-spread-to-spread-spectrum converter 112 receives parallel data and a parallel clock CLK-P, and provides the parallel data and a spread-spectrum clock signal CLK-SS to the serializer 114. As discussed in more detail below, the spread-spectrum clock signal CLK-SS is modulated by a signal whose frequency depends on the frequency of the parallel clock signal CLK-P. The converter 112 controls the modulation frequency of the spread-spectrum clock signal CLK-SS in response to variation in the frequency of the parallel clock signal CLK-P. This allows the frequency of the parallel clock signal CLK-P to be selected from a relatively wide frequency range to provide versatility for the system 100, while at the same time controlling the modulation frequency of the spread-spectrum clock signal CLK-SS to prevent undesired operational effects.

The serializer 114 then uses the spread-spectrum clock signal CLK-SS to transmit the serial data to the receiving device 130 by way of the serial data link 120. Because the spread-spectrum clock signal CLK-SS is driving the serializer 114, the energy of the transmitted serial data is spread over a defined frequency range. This reduces the energy of the signal at a particular frequency, which potentially reduces EMI. The reduction in EMI allows for the use of inexpensive and small footprint physical medium for the serial data link 120, such as unshielded twisted-wire pair. Additionally, the reduction in EMI further allows for inexpensive and smaller footprint housings for the transmitter and receiver.

The receiving device 130, in turn, comprises a deserializer 132 and a clock recovery module 134. The clock recovery module 134 receives the serial data, and generates a recovered spread-spectrum clock signal CLK-RSS. The deserializer 132 also receives the serial data and converts the serial data to parallel data using the recovered spread-spectrum clock signal CLK-RSS. The deserializer 132 further generates a recovered parallel spread-spectrum clock signal CLK-RPS associated with the parallel data. Although not shown, at the receiving device, the recovered parallel spread-spectrum clock signal CLK-RPS may be stripped of its spread-spectrum modulation in order to generate a substantially fixed frequency parallel clock signal. However, maintaining the clock in the spread-spectrum domain is often more desirable for reduced EMI at the receiver housing.

Figure 2:
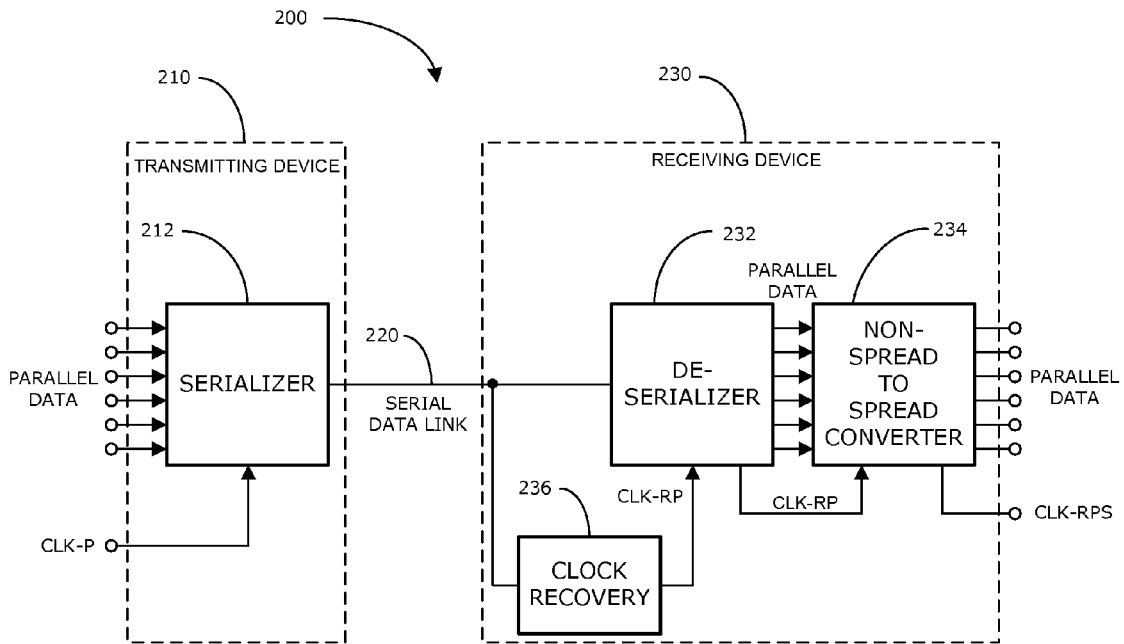
FIG. 2 illustrates a block diagram of another exemplary data communication system in accordance with another embodiment of the invention.

FIG. 2 illustrates a block diagram of another exemplary data communication system 200 in accordance with another embodiment of the invention. In summary, the data communication system 200 is configured to transmit serial data from a transmitting device to a receiving device in a non-spread-spectrum manner or at a substantially fixed data rate. At the receiving device, the serial data is converted into parallel data using a recovered clock. A spread-spectrum clock signal is then used to convert the parallel data in the non-spread domain into parallel data in the spread-spectrum domain, in order to transmit the parallel data further downstream in spread-spectrum manner for EMI reduction and/or other purposes. Additionally, the receiving device further controls the frequency of the modulation signal based on the frequency of the recovered clock signal. As discussed above, this allows the frequency of the recovered clock signal to vary substantially in order to provide flexibility for the rate in which the data is received, while at the same time controlling the frequency of the spread-spectrum modulation to prevent undesired operational effects.

In particular, the data communication system 200 comprises a transmitting device 210, a receiving device 230, and a serial data link 220 coupling the transmitting device to the receiving device. The transmitting device 210, in turn, comprises a serializer 212 adapted to convert input parallel data into serial data by using a parallel clock signal CLK-P to receive the parallel data, and generate a serial clock for transmission of the serial data to the receiving device 230 by way of the serial data link 220.

The receiving device 230, in turn, comprises a deserializer 232, a non-spread-to-spread-spectrum converter 234, and a clock recovery module 236. The clock recovery module 236 receives the serial data, and generates a recovered clock signal CLK-RP. The deserializer 232 also receives the serial data and converts the serial data into parallel data using the recovered clock signal CLK-RP. Using the recovered parallel clock signal CLK-RP, the non-spread-to-spread-spectrum converter 234 converts the received parallel data in a non-spread-spectrum domain into parallel data in a spread-spectrum domain. Additionally, the converter 234 generates a recovered parallel spread-spectrum clock signal CLK-RPS associated with the received parallel data in the spread-spectrum domain. Since the received parallel data is in the spread-spectrum domain, it may be transmitted to one or more devices further downstream for reduced EMI and/or other purposes.

As discussed in more detail below, the parallel spread-spectrum clock signal CLK-RPS is modulated by a signal whose frequency depends on the recovered parallel clock signal CLK-RP. The converter 234 controls the modulation frequency of the recovered parallel spread-spectrum clock signal CLK-RPS in response to variation in the frequency of the recovered parallel clock signal CLK-RP. This allows the frequency of the recovered parallel clock signal CLK-RP to vary substantially to provide wide data rate applications for the system 200, while at the same time controlling the modulation frequency of the recovered parallel spread-spectrum clock signal CLK-RPS to prevent undesired operational effects.

Figure 3:
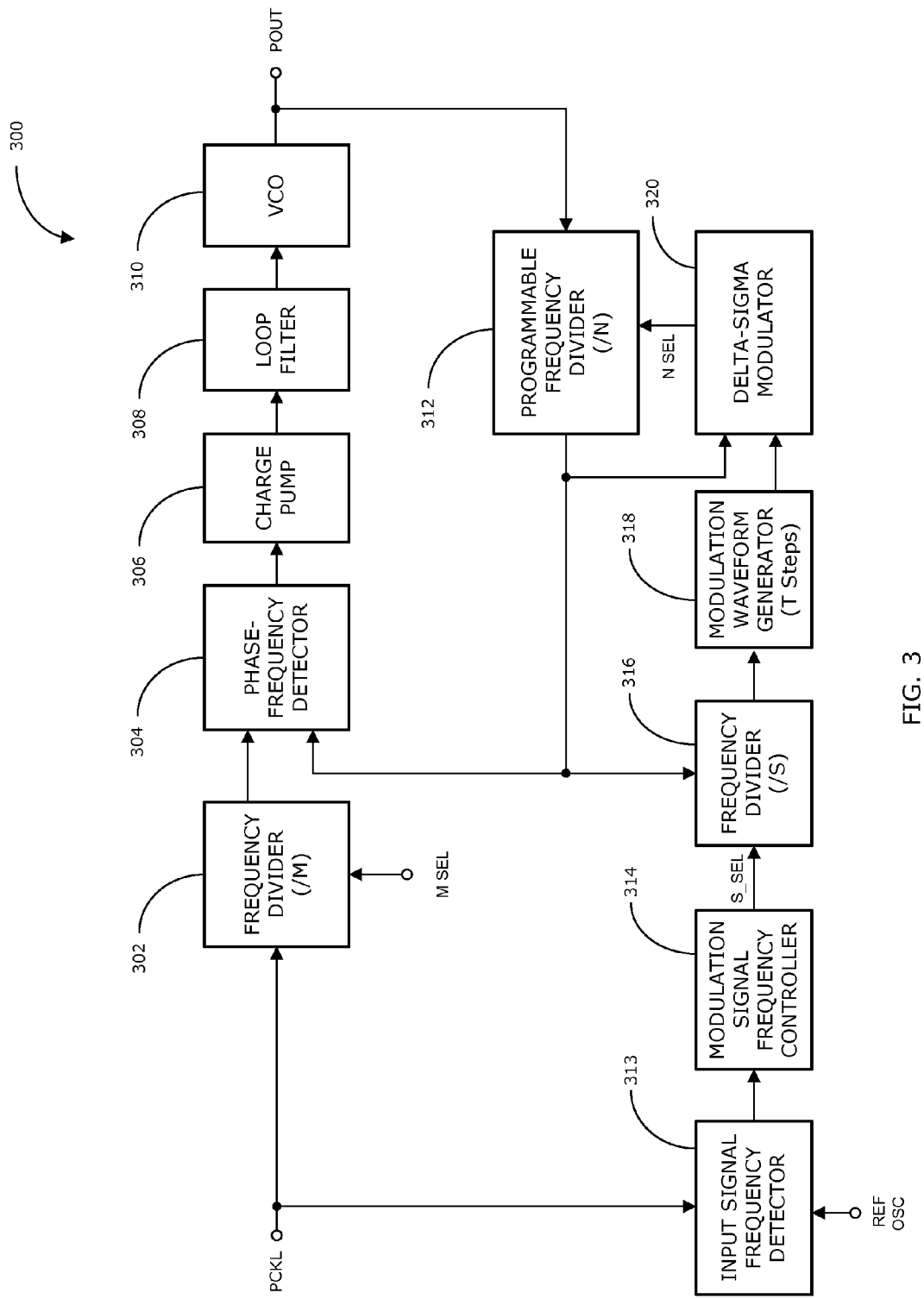
FIG. 3 illustrates a block diagram of an exemplary apparatus for generating a spread-spectrum signal in accordance with another embodiment of the invention.

FIG. 3 illustrates a block diagram of an exemplary apparatus 300 for generating a spread-spectrum signal in accordance with another embodiment of the invention. The apparatus 300 may be an exemplary detailed implementation of at least a portion of any of the converters 112 and 234 previously discussed. Also, as previously discussed, the apparatus 300 is adapted to generate a spread-spectrum signal from a non-spread-spectrum signal whose frequency may be selected from a relatively wide frequency range. In addition, the apparatus 300 is adapted to control the modulation frequency of the spread-spectrum signal such that it is maintained within a defined frequency range, even though the frequency of the input non-spread-spectrum signal may vary widely.

In particular, the apparatus 300 comprises a frequency divider (/M) 302, a phase-frequency detector 304, a charge pump 306, a loop filter 308, a voltage-controlled oscillator (VCO) 310, and a programmable frequency divider (/N) 312. Additionally, the apparatus 300 comprises an input signal frequency detector 313, a modulation frequency controller 314, a frequency divider (/S) 316, a modulation waveform generator 318, and a delta-sigma modulator 320.

The frequency divider (/M) 302 is adapted to divide the frequency of an input non-spread-spectrum clock signal PCKL by a factor M in accordance with a select signal M SEL. With reference to data communication systems 100 and 200, the input non-spread-spectrum clock signal PCKL may be an example of clock signals CLK-P and CLK-RP, respectively. A purpose of the frequency divider (/M) 302 is to reduce the frequency of the input non-spread-spectrum clock signal PCKL so it can be better tracked by the phase lock loop (PLL) elements. In this example, the PLL elements include the phase-frequency detector 304, charge pump 306, loop filter 308, VCO 310, and programmable frequency divider (/N) 312. When locked, the PLL causes the frequency and phase of the signals at the inputs of the phase-frequency detector 304 to be substantially the same. It shall be understood that the PLL may have other configurations. The resulting spread-spectrum clock signal POUT is produced at the output of the VCO 310. With reference to data communication systems 100 and 200, the output spread-spectrum clock signal POUT is an example of clock signals CLK-SS and CLK-RPS, respectively.

The spread-spectrum modulation elements include the input signal frequency detector 313, the modulation frequency controller 314, the frequency divider (/S) 316, the modulation waveform generator 318, and the delta-sigma modulator 320. These elements control the modulation frequency of the spread-spectrum clock signal POUT. The frequency of the modulation signal may be controlled to lie within a defined frequency range, notwithstanding wide variations in the frequency of the input non-spread-spectrum clock signal PCKL.

More specifically, the frequency divider (/S) 316 divides the frequency of the PLL feedback signal at the output of the programmable frequency divider (/N) 312 by a factor S. The output signal of the frequency divider (/S) 316 drives the modulation waveform generator 318. The modulation waveform generator 318 generates a substantially oscillating modulation waveform with a period comprising a defined number T of steps. The output signal of the frequency divider (/S) 316 determines the rate in which each step is generated. The modulation waveform may be any type of periodic signal, such as a triangular, Hershey-Kiss shaped waveform, etc. The delta-sigma modulator 320 receives the modulation signal from the modulation waveform generator 318, and using the PLL feedback signal from the programmable frequency divider (/N) 312, further randomizes and filters the oscillating signal from the modulation waveform generator 318 to generate the modulation signal N SEL. The modulation signal N SEL is applied to the programmable frequency divider (/N) to form the spread-spectrum clock signal POUT at the output of the VCO 310.

The frequency of the modulation signal at the output of the modulation waveform generator 318 or delta-sigma modulator 320 may be derived as follow. When the PLL is locked, the inputs to the phase-frequency detector 304 may have a frequency given by $f_{PCKL}/M$, where $f_{PCKL}$ is the frequency of the input non-spread-spectrum clock signal PCKL and M is the dividing factor of the frequency divider 302. Accordingly, the frequency of the signal at the output of the frequency divider (/S) 316 may be given by $f_{PCKL}/(M*S)$, where S is the dividing factor of the frequency divider (/S) 316. It follows then that the frequency of the oscillating signal generated by the modulation waveform generator 318 may be given by $f_{PCKL}/(M*S*T)$, wherein T is the number of steps in a period of the modulation signal. Since, as given above, the frequency of the modulation signal is substantially proportional to the frequency $f_{PCKL}$ of the input non-spread spectrum clock signal PCKL, and that frequency $f_{PCKL}$ may be selected from a relatively wide frequency range, then without providing some control, the frequency of the modulation signal would likewise vary widely. This may have adverse operational effects if the frequency of the modulation signal falls within an undesired frequency range.

Thus, in order to control the frequency of the modulation signal, the input signal frequency detector 313 and modulation frequency controller 314 generates a control signal S_SEL for the frequency divider (/S) 316 in order to maintain the frequency of the modulation signal within a defined frequency range. As discussed above, the frequency of the modulation signal may be given by $f_{PCKL}/(M*S*T)$. If the frequency $f_{PCKL}$ of the input non-spread-spectrum signal PCKL varies, the modulation frequency controller 314 varies S in order to maintain the frequency of the modulation signal within the defined frequency range. As discussed in more detail below, this is accomplished by the input signal frequency detector 313 to generate a signal related to a comparison of the frequency $f_{PCKL}$ of the input non-spread-spectrum clock signal PCKL to a substantially constant frequency of a reference oscillator signal REF OSC, and derive the control signal S_SEL based on the comparison signal.

Figure 4:
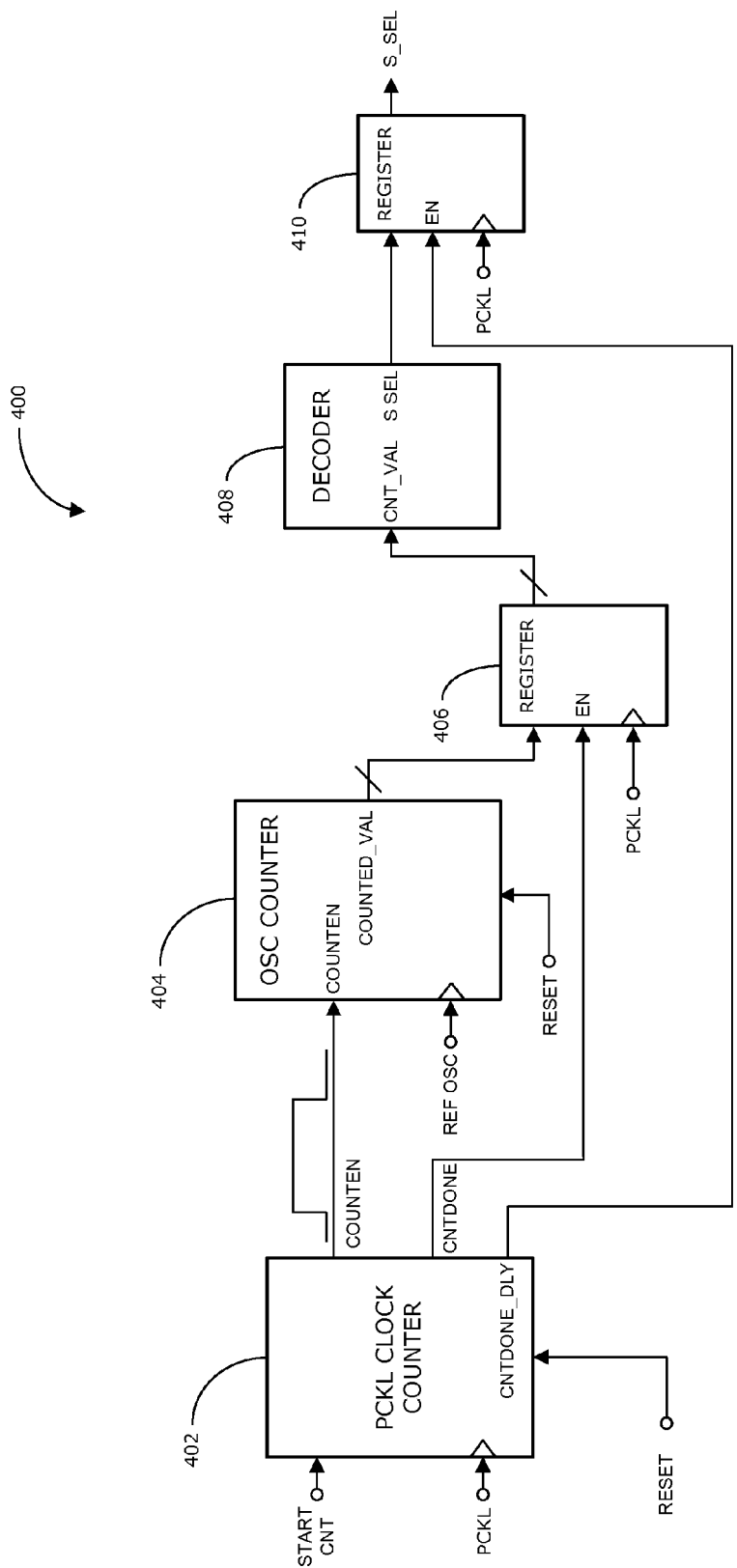
FIG. 4 illustrates a block diagram of an exemplary system for controlling a frequency of a modulation signal in accordance with another embodiment of the invention.

FIG. 4 illustrates a block diagram of an exemplary system 400 for controlling the frequency of a modulation signal in accordance with another embodiment of the invention. The system 400 may be an exemplary detailed implementation of the input signal frequency detector 313 and the modulation frequency controller 314 previously discussed. In summary, the system 400 includes one or more modules for generating a parameter indicative of the frequency $f_{PCKL}$ of the input non-spread-spectrum clock signal PCKL, and one or more modules for deriving the dividing factor S for the frequency divider (/S) 316 based the frequency $f_{PCKL}$ parameter.

More specifically, the system 400 comprises a PCKL clock counter 402, an OSC counter 404, a first register 406, a decoder 408, and a second register 410. The PCKL clock counter 402 includes an input to receive a START CNT signal that initiates a control or calibration cycle, an input adapted to receive the non-spread-spectrum clock signal PCKL, and an input adapted to receive a signal RESET that resets the PCKL clock counter. The PCKL clock counter 402 also includes an output adapted to generate a COUNTEN signal that has an asserted level (e.g., a high logic level) with a duration based on a defined number of periods of the non-spread-spectrum clock signal PCKL, an output adapted to generate a CNTDONE signal that transitions to an asserted logic level (e.g., a high logic level) a defined number of PCKL clock periods after the COUNTEN transitions to the unasserted logic level (e.g., the low logic level), and an output adapted to generate a CNTDONE_DLY signal that transitions to an asserted logic level a defined number of PCKL clock periods after the CNTDONE transitions to the asserted logic level.

The OSC counter 404 includes an input adapted to receive the COUNTEN signal, an input to receive a substantially frequency stable clock signal REF OSC from a reference oscillator, and an input adapted to receive the RESET signal. The OSC counter 404 includes an output adapted to generate a signal COUNTED_VAL, which provides an indication of the frequency $f_{PCKL}$ of the input non-spread-spectrum clock signal PCKL. The first register 406 includes a data input adapted to receive the COUNTED_VAL signal from the OSC counter 404, an enable input adapted to receive the CNTDONE signal from the PCKL clock counter 402, and a clock input adapted to receive the input non-spread-spectrum clock signal PCKL. The first register 406 also includes a data output adapted to produce the resulting COUNTED_VAL signal.

The decoder 408 includes an input adapted to receive the resulting COUNTED_VAL signal from the data output of the first register 406. The decoder 408 also includes an output adapted to produce the resulting dividing parameter S_SEL for the frequency divider (/S) 316. The second register 410 includes a data input adapted to receive the resulting dividing parameter S_SEL from the decoder 408, an enable input adapted to receive the CNTDONE_DLY signal from the PCKL clock counter 402, and a clock input adapted to receive the non-spread-spectrum clock signal PCKL. The second register 410 includes an output adapted to transmit the resulting dividing parameter S_SEL to the frequency divider (/S) 316.

The operation of the system 400 is as follows. In response to the START CNT signal transitioning to an asserted logic level, the PCKL clock counter 402 causes the COUNTEN signal to transition from an unasserted logic level to an asserted logic level, and maintain the signal at the asserted logic level for a defined number of periods of the non-spread-spectrum clock signal PCKL. Thus, the COUNTEN signal remains at the asserted logic level for a duration related to the frequency $f_{PCKL}$ of the non-spread-spectrum clock signal PCKL. In response to the COUNTEN signal transitioning to the asserted logic level, the OSC counter 404 begins counting periods of the reference oscillator signal REF OSC, wherein the current count is indicated by the COUNTED_VAL signal. When the COUNTEN signal transitions from the asserted logic level to the unasserted logic level, the OSC counter 404 stops counting periods of the reference oscillator signal REF OSC. The resulting value of the COUNTED_VAL provides a good indication of the frequency $f_{PCKL}$ of the non-spread-spectrum clock signal PCKL.

A few cycles of the signal PCKL after the COUNTEN signal transitions to the unasserted logic level, the PCKL clock counter 402 causes the CNTDONE signal to transition from an unasserted logic level to an asserted logic level. This enables the first register 406, which clocks the resulting COUNTED_VAL to its data output in response to a triggering edge of the clock signal PCKL. The decoder 408 then, using a look-up table, an equation, algorithm, or other technique, maps the resulting COUNTED_VAL value to a dividing parameter S_SEL value. A few cycles of the signal PCKL after the CNTDONE signal transitions to the asserted logic level, the PCKL clock counter 402 causes the CNTDONE_DLY signal to transition from an unasserted logic level to an asserted logic level. This enables the second register 410, which clocks the dividing parameter S_SEL value to its data output, which is coupled to the frequency divider (/N) 316. Once the resulting dividing parameter S_SEL is generated, the RESET signal transitions from an unasserted logic level to an asserted logic level to reset the counters 402 and 404 for the next control or calibration cycle.

The decoder 408 generates the dividing parameter S_SEL value based on the resulting COUNTED_VAL in order to maintain the frequency of the modulation signal within a defined frequency range. As previously discussed, the frequency of the modulation signal may be given by $f_{PCKL}/(M*S*T)$. Accordingly, the dividing parameter S_SEL is related to the frequency $f_{PCKL}$ of the non-spread-spectrum clock signal PCKL. Thus, as the frequency $f_{PCKL}$ of the non-spread-spectrum clock signal PCKL increases, the decoder 408 generates a dividing parameter S_SEL value that is higher than the previously-derived S_SEL value derived. Conversely, as the frequency $f_{PCKL}$ of the non-spread-spectrum clock signal PCKL decreases, the decoder 408 generates a dividing parameter S_SEL value that is lower than the previously-derived S_SEL value.

Figure 5:
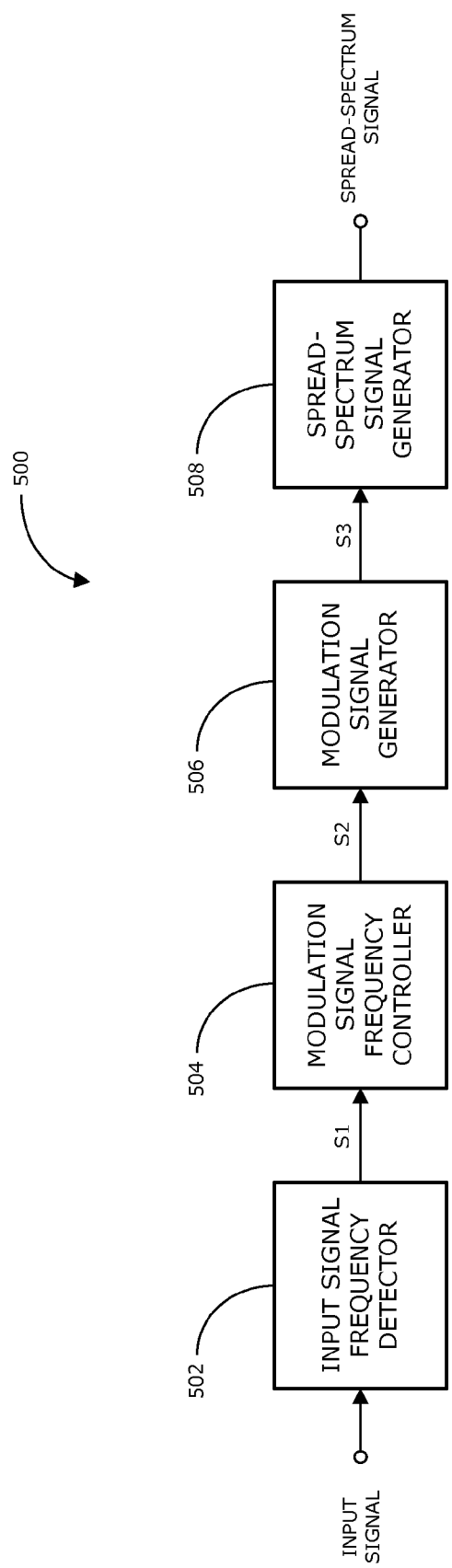
FIG. 5 illustrates a block diagram of another exemplary apparatus for generating a spread-spectrum signal in accordance with another embodiment of the invention.

FIG. 5 illustrates a block diagram of another exemplary apparatus 500 for generating a spread-spectrum signal in accordance with another embodiment of the invention. In summary, the apparatus 500 is configured to generate a spread-spectrum signal that is based on an input signal. Additionally, the apparatus 500 includes modules for controlling the frequency modulation of the output signal such that it is maintained within a defined frequency range. There are many advantages for controlling the modulation frequency. One example, as discussed above, is that the frequency of the input reference signal may be selected over a wide frequency range for system versatility purposes, while still maintaining control of the modulation frequency.

More specifically, the apparatus 500 comprises an input signal frequency detector 502, a modulation signal frequency controller 504, a modulation signal generator 506, and a spread-spectrum signal generator 508. The input signal frequency detector 502 receives the input signal, and generates a first signal S1 indicative or related to the frequency of the input signal. As an example, in the system 400 previously discussed, the PCKL clock counter 402, OSC counter 404, and first register 406 may be an implementation of the input signal frequency detector 502. The modulation signal frequency controller 504 generates a second signal S2 for controlling the frequency of a modulation signal S3 based on the signal S1. As an example, this allows the frequency of the input signal to vary widely as indicated by signal S1, while the modulation signal frequency controller 504 generates the second signal S2 to control the frequency of the modulation signal S3. As an example, in the system 400 previously discussed, the decoder 408 and second register 410 may be an implementation of the modulation signal frequency controller 504.

The modulation signal generator 506 generates the modulation signal S3 based on the second signal S2 generated by the modulation signal frequency controller 504. As an example, in the apparatus 300 previously discussed, the frequency divider 316, modulation waveform generator 318, and delta-sigma modulator 320 may be an implementation of the modulation signal generator 506. Finally, the spread-spectrum signal generator 508 generates the spread-spectrum signal, which is modulated by the modulation signal S3. As an example, in the apparatus 300 previously discussed, the PLL elements, namely the phase-frequency detector 304, charge pump 306, loop filter 308, VCO 310, and programmable frequency divider 312 may be an implementation of the spread-spectrum signal generator 508.

While the invention has been described in connection with various embodiments, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. An apparatus for generating a spread-spectrum signal, comprising:
 a detector adapted to generate a first signal related to a frequency of an input signal;
 a controller adapted to generate a second signal for controlling a frequency of a modulation signal based on the first signal;
 a modulation signal generator adapted to generate the modulation signal based on the second signal;
 a spread-spectrum signal generator adapted to generate the spread-spectrum signal based on the modulation signal;
 a first counter adapted to generate a third signal having an asserted logic level with a duration related to the frequency of the input signal; and
 a second counter adapted to generate a count based substantially on a number of periods of a reference oscillator signal that are generated within the duration of the asserted logic level of the third signal, wherein the first signal comprises the count.

2. The apparatus of claim 1, wherein the detector further comprises a first register adapted to output the count based on a fourth signal generated by the first counter and the input signal.

3. The apparatus of claim 2, wherein the fourth signal is adapted to enable the first register at substantially a defined time interval after an end of the asserted logic level of the third signal.

4. The apparatus of claim 2, wherein the first register is adapted to output the count in response to a triggering edge of the input signal.

5. The apparatus of claim 2, wherein the controller comprises a decoder adapted to generate the second signal based on the count.

6. The apparatus of claim 5, wherein the decoder comprises a look-up-table to map the count to the second signal.

7. The apparatus of claim 5, wherein the decoder is adapted to execute an algorithm or perform an equation operation to generate the second signal from the count.

8. The apparatus of claim 5, wherein the controller further comprises a second register adapted to output the second signal based on a fifth signal generated by the first counter and the input signal.

9. The apparatus of claim 8, wherein the fifth signal is adapted to enable the second register at substantially a defined time interval after an end of the asserted logic level of the third signal.

10. The apparatus of claim 8, wherein the second register is adapted to output the second signal in response to a triggering edge of the input signal.

11. The apparatus of claim 1, wherein the controller is adapted to generate the second signal to maintain the frequency of the modulation signal to within a defined frequency range in response to variation in the frequency of the input signal.

12. The apparatus of claim 1, wherein the controller comprises a decoder adapted to generate the second signal based on the first signal.

13. The apparatus of claim 12, wherein the decoder comprises a look-up-table to map the first signal to the second signal.

14. The apparatus of claim 12, wherein the decoder is adapted to execute an algorithm or perform an equation operation to generate the second signal from the first signal.

15. The apparatus of claim 1, wherein the modulation signal generator comprises a frequency divider adapted to generate a third signal by dividing a frequency of a fourth signal in accordance with the second signal.

16. The apparatus of claim 15, wherein the modulation signal generator further comprises a modulation waveform generator adapted to generate a fifth signal including a period comprising a defined number of steps, wherein a rate of the steps is controlled by the third signal.

17. The apparatus of claim 16, wherein the fifth signal comprises a substantially triangular or Hershey-kiss shaped periodic waveform.

18. The apparatus of claim 16, wherein the modulation signal generator further comprises a delta-sigma modulator adapted to generate the modulation signal based on the fourth and fifth signals.

19. The apparatus of claim 18, wherein the spread-spectrum signal generator comprises a phase locked loop (PLL), and wherein the fourth signal is produced by the PLL.

20. The apparatus of claim 19, wherein the PLL comprises:
a voltage-controlled oscillator (VCO) adapted to generate the spread-spectrum signal; and
a programmable frequency divider adapted to generate the fourth signal based on the spread-spectrum signal and the modulation signal.

21. The apparatus of claim 1, wherein the spread-spectrum signal generator comprises a phase lock loop (PLL) adapted to generate the spread-spectrum signal based on the modulation signal.

22. The apparatus of claim 21, wherein the PLL comprises:
a voltage controlled oscillator (VCO) adapted to generate the spread-spectrum signal;
a programmable frequency divider adapted to generate a third signal by dividing the frequency of the spread-spectrum signal by a factor controlled by the modulation signal;
a phase-frequency detector adapted to generate an error signal based on the third signal and a fourth signal related to the input signal; and
a control circuit adapted to control the VCO based on the error signal.

23. The apparatus of claim 22, further comprising a frequency divider adapted to divide the frequency of the input signal to generate the fourth signal.

24. The apparatus of claim 22, wherein the control circuit comprises:
a charge pump adapted to generate a current based on the error signal; and
a filter adapted to develop a control voltage for the VCO based on the current generated by the charge pump.

25. An apparatus for transmitting data at a rate based on an input clock signal, comprising: an apparatus for generating a spread-spectrum clock signal, comprising:
a detector adapted to generate a first signal related to a frequency of the input clock signal;
a controller adapted to generate a second signal for controlling a frequency of a modulation signal based on the first signal;
a modulation signal generator adapted to generate the modulation signal based on the second signal;
a spread-spectrum signal generator adapted to generate the spread-spectrum clock signal based on the modulation signal; and an apparatus adapted to transmit the data based on the spread-spectrum clock signal;
a first counter adapted to generate a third signal having an asserted logic level with a duration related to the frequency of the input signal; and
a second counter adapted to generate a count based substantially on a number of periods of a reference oscillator signal that are generated within the duration of the asserted logic level of the third signal, wherein the first signal comprises the count.

* * * * *